(12) United States Patent
Coulson et al.

(10) Patent No.: US 7,286,387 B2
(45) Date of Patent: Oct. 23, 2007

(54) REDUCING THE EFFECT OF WRITE DISTURBS IN POLYMER MEMORIES

(75) Inventors: Richard L. Coulson, Porland, OR (US); Jonathan C. Lueker, Portland, OR (US); Robert W. Faber, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 77 days.

(21) Appl. No.: 11/126,685

(22) Filed: May 11, 2005

(65) Prior Publication Data

US 2005/0207206 A1    Sep. 22, 2005

Related U.S. Application Data

(62) Division of application No. 10/256,679, filed on Sep. 27, 2002, now Pat. No. 6,922,350.

(51) Int. Cl.
*G11C 11/00* (2006.01)
(52) U.S. Cl. .................. 365/151; 365/153; 365/108; 365/45; 349/183
(58) Field of Classification Search .............. 365/151, 365/153, 108, 45; 349/184
See application file for complete search history.

(56) References Cited

U.S. PATENT DOCUMENTS

| | | | | |
|---|---|---|---|---|
| 3,990,098 A | * | 11/1976 | Mastrangelo ............. 257/43 |
| 4,150,397 A | * | 4/1979 | Russell ..................... 386/128 |
| 4,232,376 A | * | 11/1980 | Dion et al. ................ 365/222 |
| 4,531,147 A | * | 7/1985 | Kouyama ................... 348/514 |
| 4,679,139 A | * | 7/1987 | Durbin ......................... 707/1 |
| 4,742,474 A | * | 5/1988 | Knierim ..................... 345/545 |
| 4,935,731 A | * | 6/1990 | Takebe et al. ............. 345/213 |
| 5,057,916 A | * | 10/1991 | Krause et al. ......... 375/240.12 |
| 5,061,919 A | * | 10/1991 | Watkins ..................... 715/806 |
| 5,325,342 A | * | 6/1994 | Vo-Dinh .................. 369/13.01 |
| 5,442,588 A | * | 8/1995 | Runas ....................... 365/222 |
| 5,451,979 A | * | 9/1995 | Levac ......................... 345/82 |
| 5,717,153 A | * | 2/1998 | Morikawa et al. ............ 84/603 |
| 6,713,389 B2 | * | 3/2004 | Speakman .................. 438/674 |
| 6,879,528 B2 | * | 4/2005 | Takeuchi et al. ........... 365/200 |
| 6,922,350 B2 | * | 7/2005 | Coulson et al. ............. 365/121 |
| 6,925,015 B2 | * | 8/2005 | Garney et al. ......... 365/189.02 |
| 6,967,884 B2 | * | 11/2005 | Hsu ........................... 365/211 |
| 7,003,469 B2 | * | 2/2006 | Okayama et al. ............ 704/502 |
| 7,038,645 B2 | * | 5/2006 | Ozawa et al. ................ 345/89 |
| 7,129,166 B2 | * | 10/2006 | Speakman .................. 438/674 |
| 2004/0151014 A1 | * | 8/2004 | Speakman ................... 365/49 |

* cited by examiner

*Primary Examiner*—Viet Q. Nguyen
(74) *Attorney, Agent, or Firm*—Trop, Pruner & Hu, P.C.

(57) ABSTRACT

The write disturb that occurs in polymer memories may be reduced by writing back data after a read in a fashion which offsets any effect on the polarity of bits in bit lines associated with the addressed bit. For example, each time the data is written back, its polarity may be alternately changed. In another embodiment, the polarity may be randomly changed.

16 Claims, 8 Drawing Sheets

REDUCING THE EFFECT OF WRITE DISTURBS IN POLYMER MEMORIES

This is a divisional of prior application Ser. No. 10/256,679, filed Sep. 27, 2002, now U.S. Pat. No. 6,922,350.

BACKGROUND

This invention relates generally to polymer memories.

In polymer memories, the polarization of a polymer may be altered by changing the voltage applied across that polymer. An array of row and column or bit lines may be arranged transversely to one another with polymer material between those rows and columns at each row line/column line intersection. The intersection of each row and column defines a single memory element, or "pixel." Any number of stacks of polymer memory layers may be combined to increase the memory capacity. Polymer memories are also called thin film electronics memory and polymer ferroelectric random access memory.

Generally, the polarization of the memory pixel is achieved upon the application of an appropriate voltage. In the course of writing to a given location, however, unaddressed bits on the same bit or column line experience a voltage that is less than the normal voltage used to achieve the desired polarization of a pixel. This voltage is called the write disturb voltage. The disturb voltage may be of either positive or negative polarity.

For a small number of applied disturb voltage occurrences, due to a small number of write sequences, an unaddressed pixel retains nearly all of its intended polarization. However, if a large number of writes occur that affect the same unaddressed bit, and if those writes all have the same polarity, the polarization of an unaddressed bit can be reduced to the point where its content is corrupted. This may result in a bit error.

The problem is aggravated in polymer memories because polymer memory read operations are destructive. As a result, after each read operation, the data is written back to the same location. As a side effect of these repeated writes after each read, adjacent bits on the same bit lines in the array may experience disturb voltages. The polarity of the disturbed voltage is determined by the value of the bit being written on the associated bit line. If an address is read many times, the data must be written back an equal number of times, all with the same polarity. The cumulative effect of these write disturbs may degrade noise margin at other locations.

Thus, there is a need for a way to reduce the write disturb problem in polymer memories.

DETAILED DESCRIPTION

Figure 1:
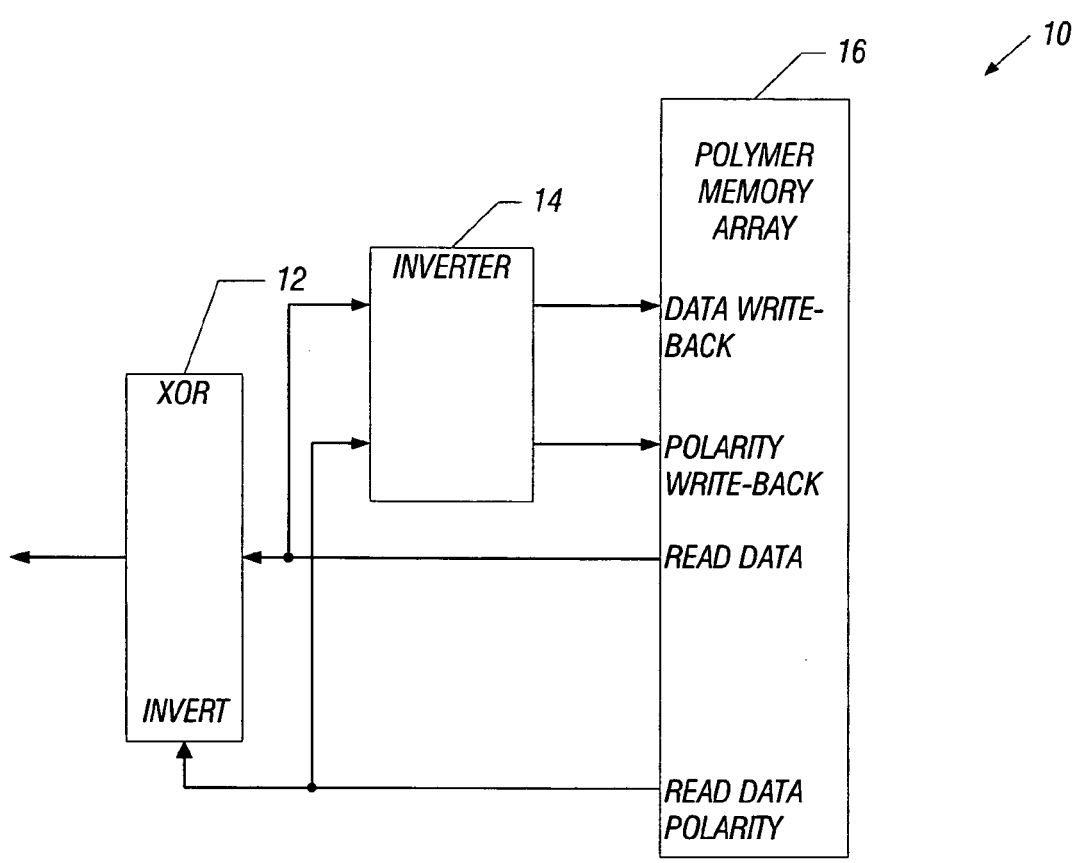
FIG. 1 is a schematic depiction of one embodiment of the present invention.

Referring to FIG. 1, a polymer memory 10 may include an exclusive or (XOR) gate 12 coupled to an inverter 14 that in turn couples to a polymer memory array 16, in one embodiment of the present invention. In the polymer array 16, an extra bit, referred to herein as a polarity bit, may be stored for each address in accordance with one embodiment of the present invention. The polarity bit may indicate whether the stored data has been inverted. When the polarity bit associated with any address is one, that may indicate that the data stored therein is inverted as one example. When that data is read, if the polarity bit is one, then the data may be inverted as part of the read process.

Thus, referring to FIG. 1, when the data is read, the polarity data may be provided to one input of the exclusive or gate 12 and the actual data may be provided to a different input of the exclusive or gate 12. Based on the polarity data, a decision may be made whether to invert the read data before outputting that data.

Conversely, if the polarity bit is zero, in one embodiment, the data is not inverted and, again, the data arrives at the outputs in a non-inverted state. In one embodiment, although the scope of the present invention is not limited in this respect, when the data is written back after a read operation, the data is inverted, as is the polarity bit that is written back. Thus, as indicated in FIG. 1, when data is written back the data may be written through the inverter 14 to the data write back port of the array 16, while a polarity indication is written back at the polarity write back port of the memory array 16.

This means that disturbs to other addresses, as a result of repeated write backs, will be balanced when a location is repetitively read in one embodiment, although the scope of the present invention is not limited in this respect. In other words, when the data is written back after a read, its polarity may be reversed so that the effect of the write back on any bits in any associated bit lines is repeatedly reversed, removing any cumulative disturb effect. The balanced disturbs that result may not reduce noise margin in the way that unipolar disturbs do so, resulting in improved noise margin.

In some embodiments of the present invention the inversion may be done on a random basis. Thus, instead of repeatedly alternating the polarity, the polarity may be changed in a random fashion. In this case, the polarity may be randomly selected on each write back.

Figure 2:
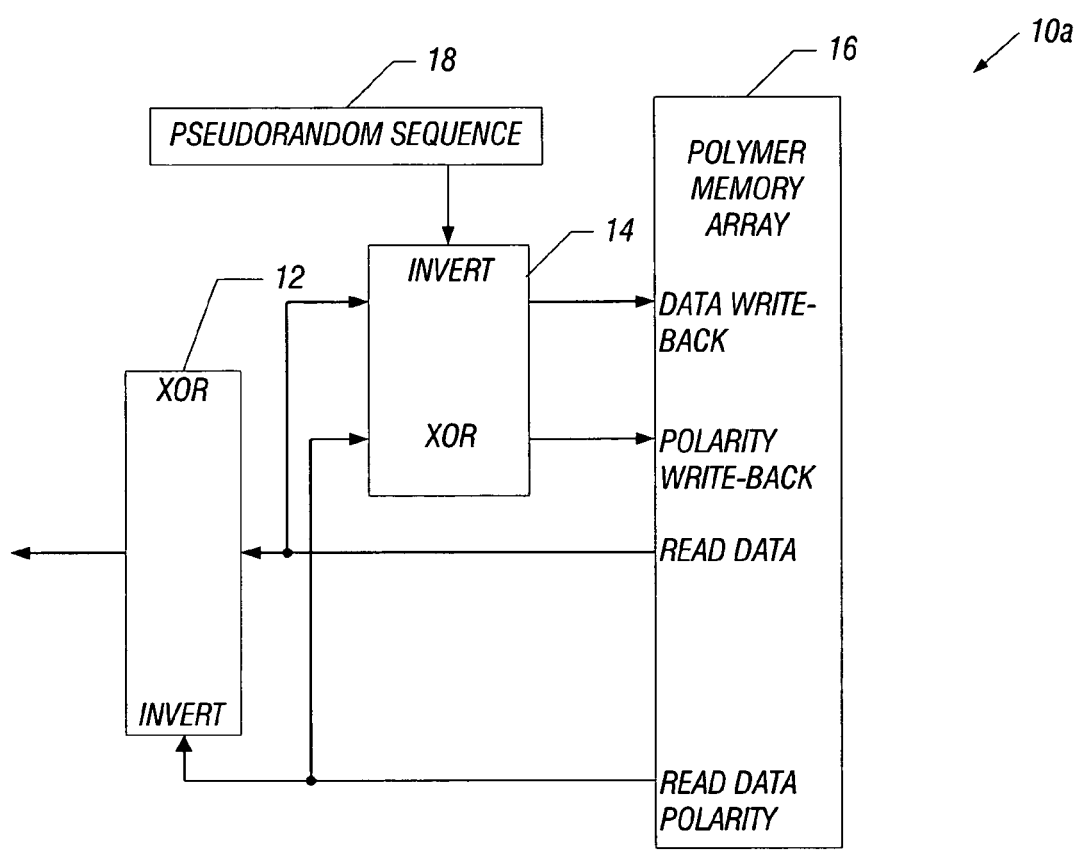
FIG. 2 is a schematic depiction of another embodiment of the present invention.

Referring to FIG. 2, in accordance with another embodiment of the present invention, a polarity bit may also be stored in the array 16 for a number of addresses. The polarity bit indicates whether the stored data is inverted. A pseudorandom sequence generator 18 may be utilized to control whether the inverter 14 inverts the write back data, or not. Because of the randomness of the signal from the generator 18, the pattern of inversion may be varied sufficiently to avoid unnecessary disturbs when simple test patterns, like alternating ones and zeros are used. The probability of any sequence resulting in a stream of unipolar disturbs is the same as the probability of matching the pseudorandom sequence.

Figure 3:
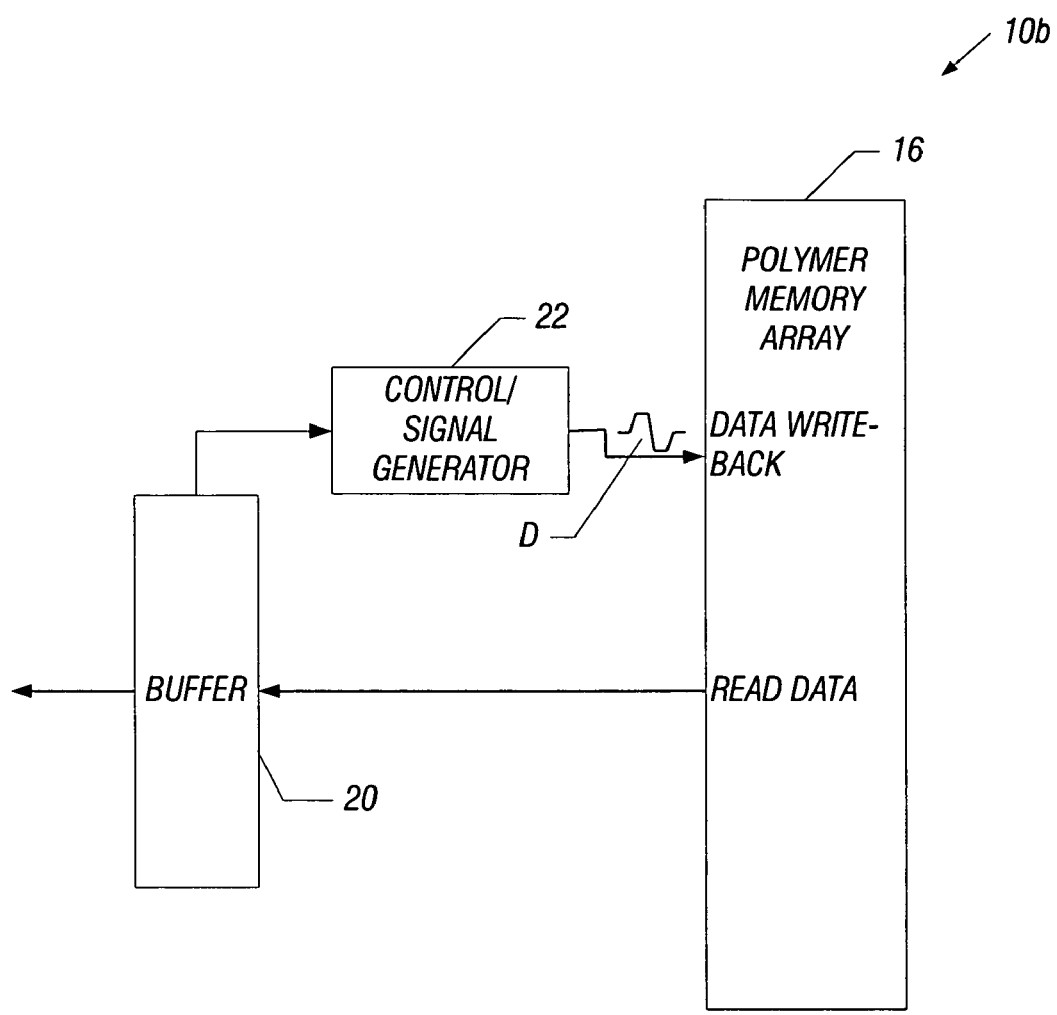
FIG. 3 is a schematic depiction of another embodiment of the present invention.

In accordance with another embodiment of the present invention, shown in FIG. 3, two global unipolar disturbs "D"

may be applied to all pixels of the memory 10b. The term "global" refers to a disturb applied to all or substantially all of the memory pixels. The term "disturb" refers to a positive or negative voltage applied to a pixel. One of the global unipolar disturbs may be in each direction, the two global unipolar disturbs, in opposite directions, may be generated automatically every N memory accesses. This may reduce the likelihood that any pixel sees more than N unipolar disturbs in the same direction.

For some polymer memories it may be observed that a string of greater than 64 unipolar disturbs may start to cause enough polarization degradation to raise concerns, but a disturb in the opposite direction may restore the disturbed pixel to full charge. Thus, in one embodiment of the present invention, N is 64 and two unipolar disturbs are globally applied every 64 cycles, in the opposite directions, to break up any string of unipolar disturbs in the same-direction, although the scope of the present invention is not limited in this respect. No actual read or write need be accomplished and the performance penalty may be relatively small in some embodiments.

Thus, as shown in FIG. 3, the control/signal generator 22 monitors for the number of consecutive write backs. When that number has been achieved, as determined by the generator 22, a global unipolar disturb of a first direction and a global unipolar disturb of the opposite direction may be automatically generated as indicated at D.

Thus, in some embodiments, it may not be necessary to determine whether a string of N unipolar disturbs in the same direction has occurred. The global disturbs may simply be accomplished regardless of the nature of the polarity of the write backs. In other embodiments, it may be desirable to generate the opposite direction global disturbs when a string of a sufficient number of unipolar disturbs in the same direction have been detected by the control/signal generator 22. Other variations are also possible.

Figure 4:
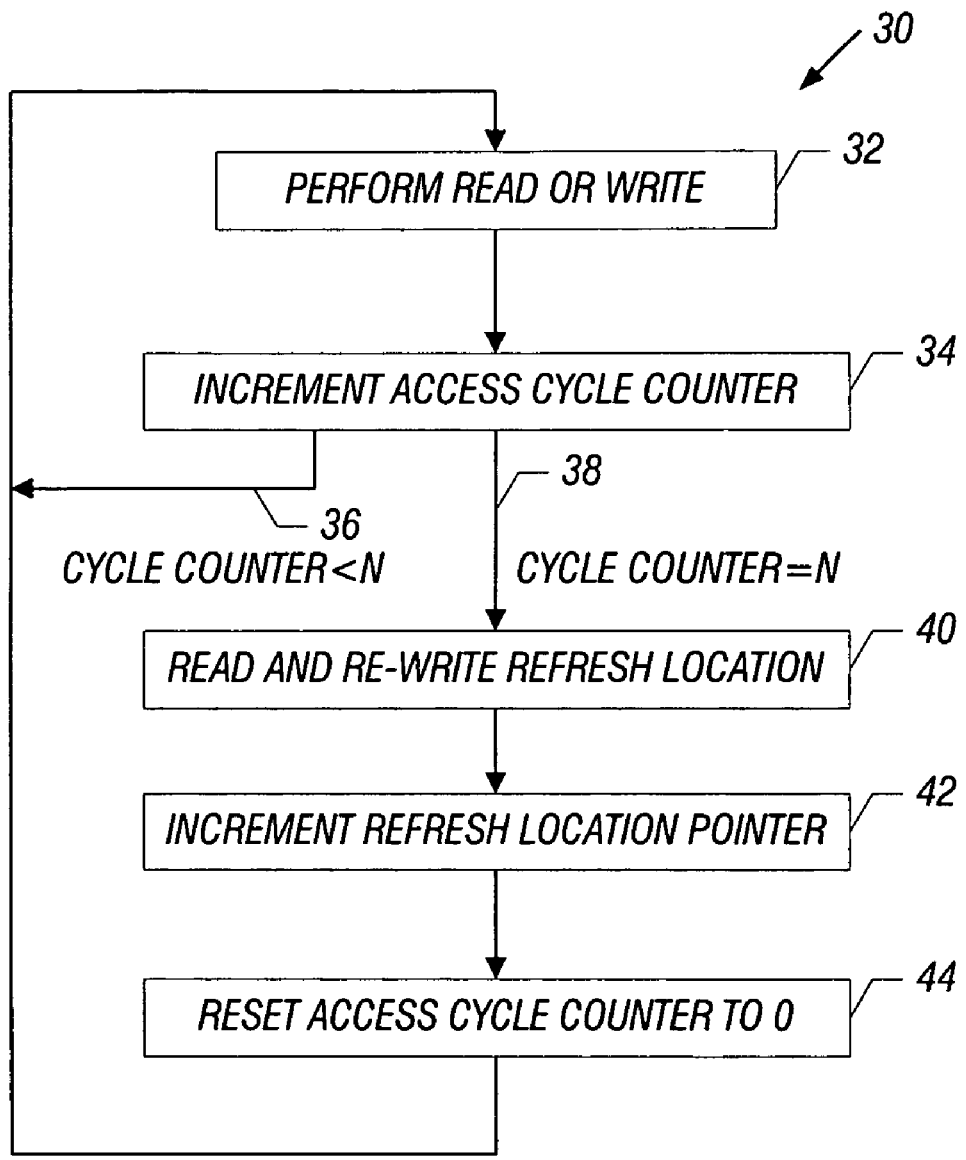
FIG. 4 is a flow chart for one embodiment of the present invention.

Referring to FIG. 4, in accordance with still another embodiment of the present invention, the memory array 16 may be periodically refreshed. Through the process of refreshing pixels in the entire memory array in series at opportune times, a disturbed pixel may be restored to its designated polarization state, either zero or one, although the scope of the present invention is not limited in this respect. In other words, the current state of a given pixel may be read and that state may be written back so that the proper voltage for that state is then established at the pixel.

Referring to FIG. 4, the flow 30 begins by reading and writing regularly in the array 16 as indicated at 32. When a read or write occurs, an address cycle counter may be incremented as indicated at block 34. If the cycle counter is still less than a given number N, the flow iterates at 36 through the blocks 32 and 34.

When the cycle counter equals N as indicated at 38, a given memory location is read and rewritten in a refresh operation as indicated in block 40. In one embodiment, the first refresh may occur at a lowest addressable address in the array, as one example. However, any technique may be used to select the initial address to refresh. Then, in one embodument, a refresh location pointer may be incremented to point to the next adjacent memory location as indicated in block 42. The address cycle counter is reset to zero as indicated in block 44 and the flow iterates back to block 32. The next time the cycle counter equals N, the adjacent pixel is refreshed.

As a result, the entire array is periodically refreshed pixel by pixel, thereby progressively undoing any potential disturb effect, although the scope of the present invention is not limited in this respect.

Figure 5:
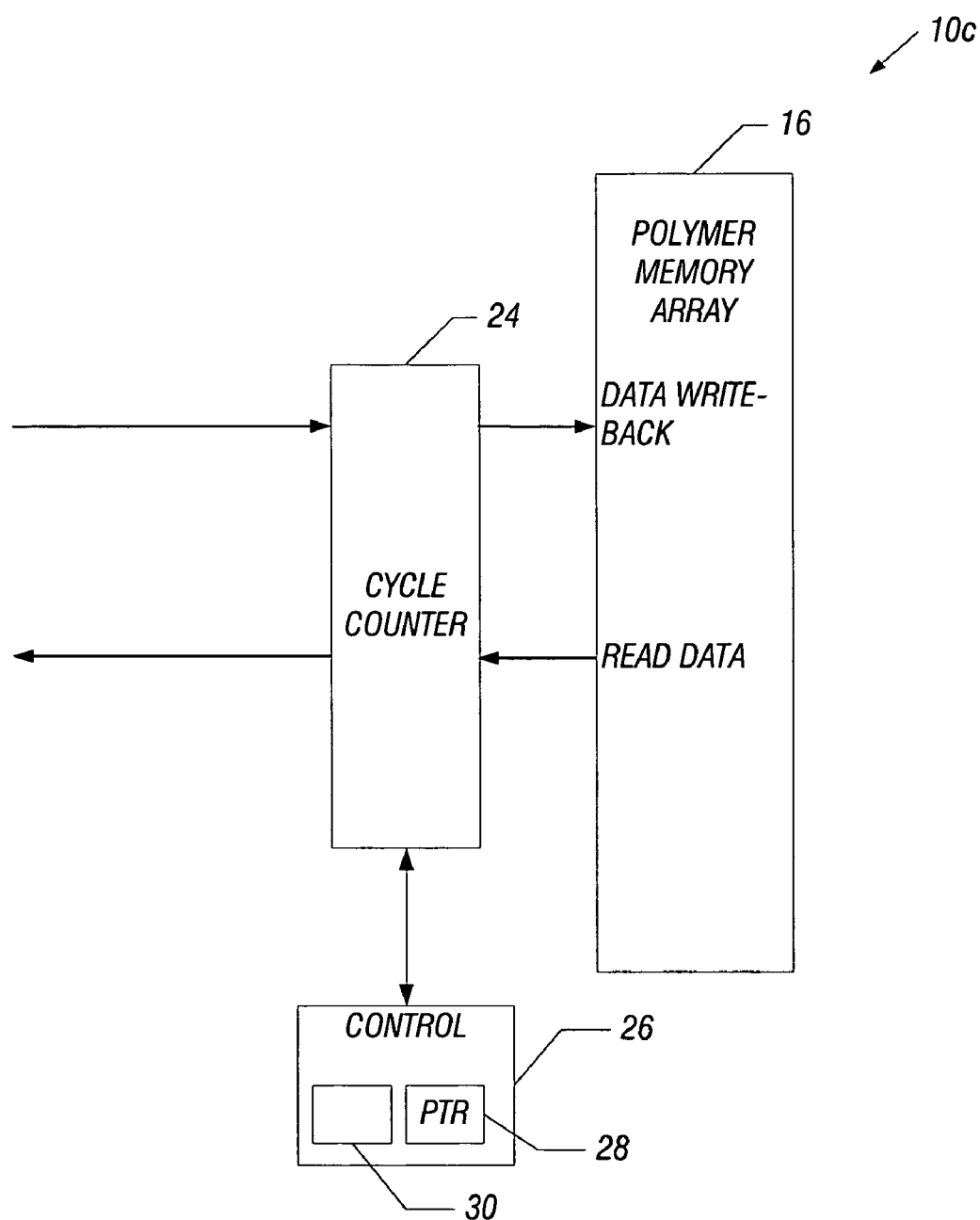
FIG. 5 is a schematic depiction of still another embodiment of the present invention.

Referring to FIG. 5, the memory array 16 of a polymer memory 10c may receive data write back accesses and read data as indicated. A cycle counter 24 may be positioned to count write backs and reads. A control 26 may store information about a refresh location pointer 28. In one embodiment, the pointer 28 information may be stored in the array 16 itself. In addition, the control 26 may store code in a storage 30 to control the refresh according to the flow shown in FIG. 4 in one embodiment. In some embodiments, the storage 30 may also be part of the array 16.

Figure 6:
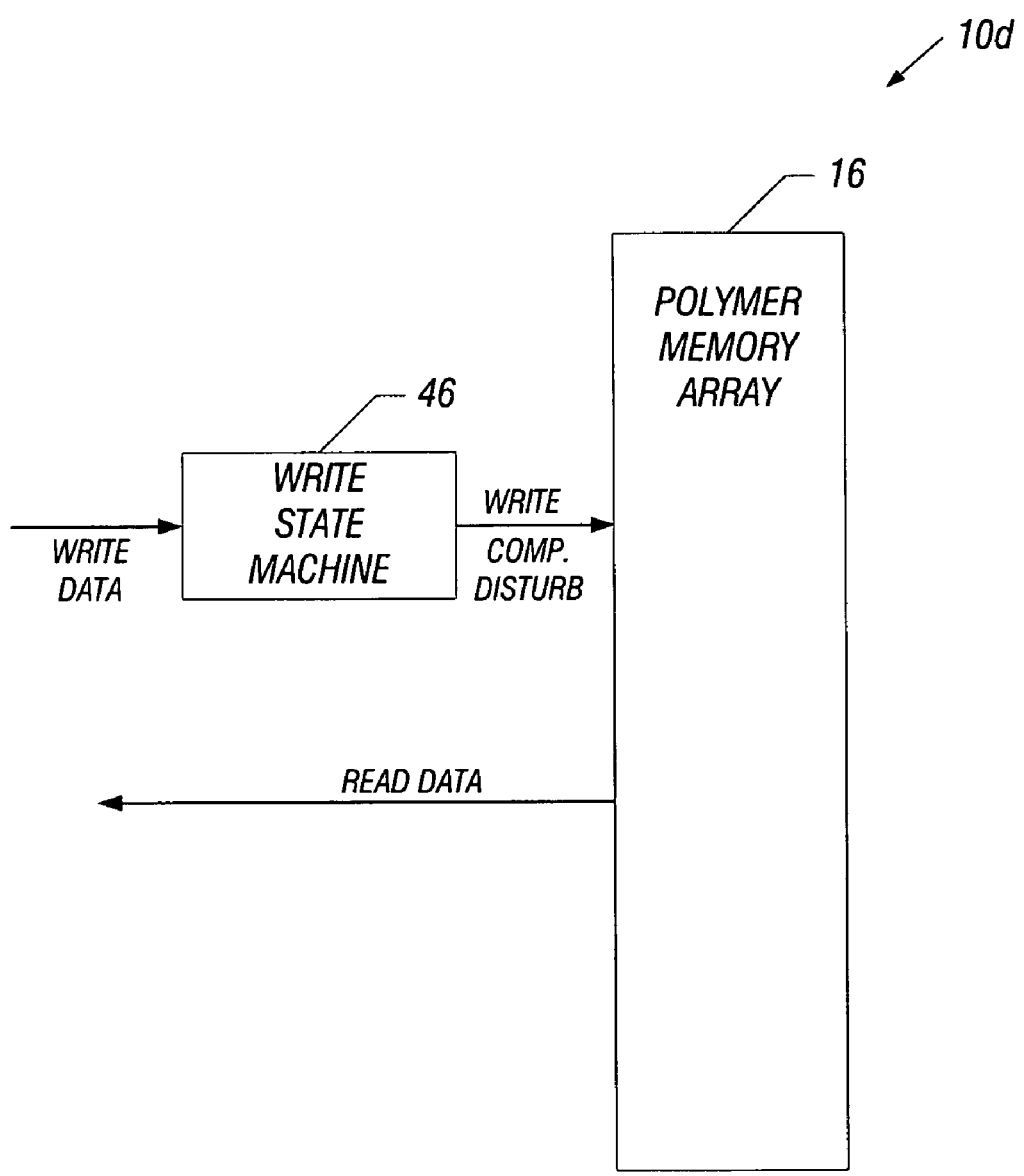
FIG. 6 is a schematic depiction of still another embodiment of the present invention.

Referring to FIG. 6, a polymer memory 10d may provide a compensating disturb prior to some or all memory cell writes in accordance with one embodiment of the present invention. The cells of the memory 10d included in the polymer memory array 16, including the actually addressed memory cell, may be driven to experience a disturb voltage, with a polarity opposite to that experienced when the address memory cell write is performed. In one embodiment, the disturb voltage may be the polarizing voltage V divided by three, although the scope of the present invention is not limited in this respect. As a result, a deterministically balanced sequence of positive and negative disturbs are experienced by all memory cells.

Thus, polymer memory array 16 may receive writes or compensating disturbs from the write state machine 46. The write state machine 46 may receive information about when write data is going to be written to the array 16. The write state machine 46 may then control the writing so as to be preceeded by a compensating disturb.

Figure 7:
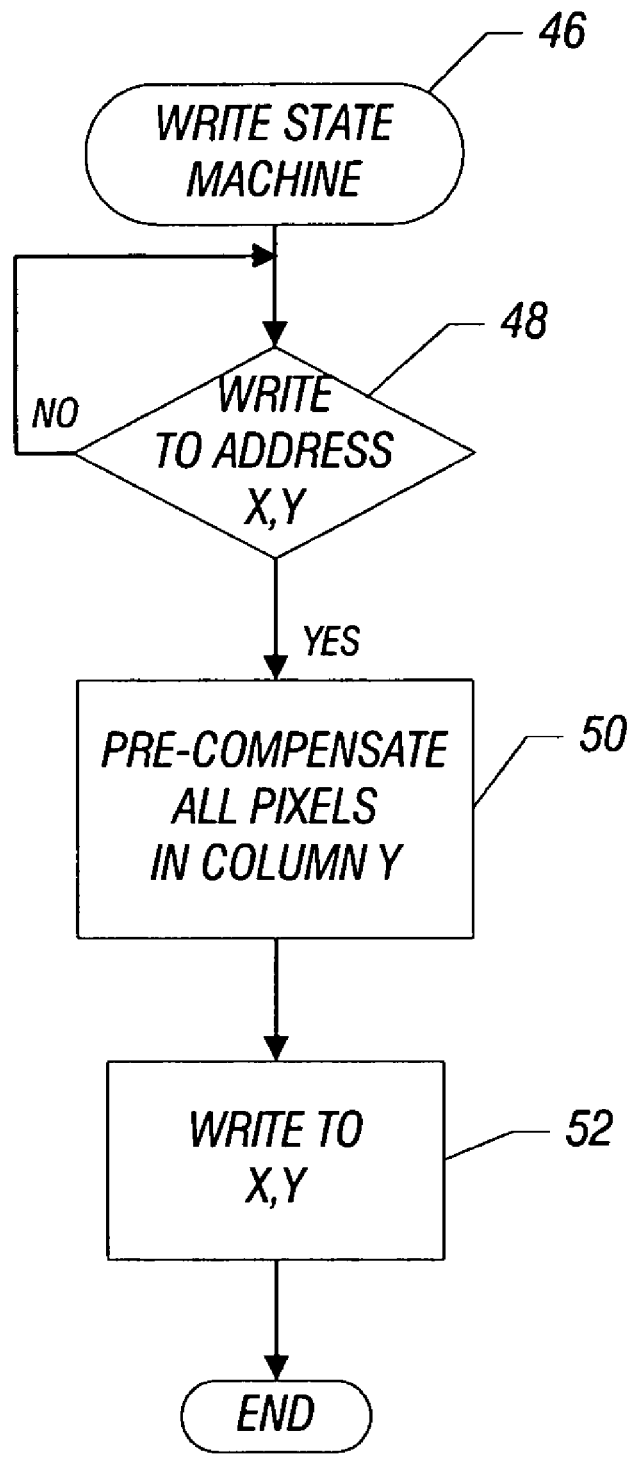
FIG. 7 is a flow chart for one embodiment of the present invention.

Thus, referring to FIG. 7, the write state machine 46 may initially determine whether there is a write to a particular address as indicated in diamond 48. Pixels in the addressed column may then be precompensated with the appropriate disturb voltage as indicated in block 50. Thereafter, the addressed pixel may be written as indicated in block 52.

Figure 8:
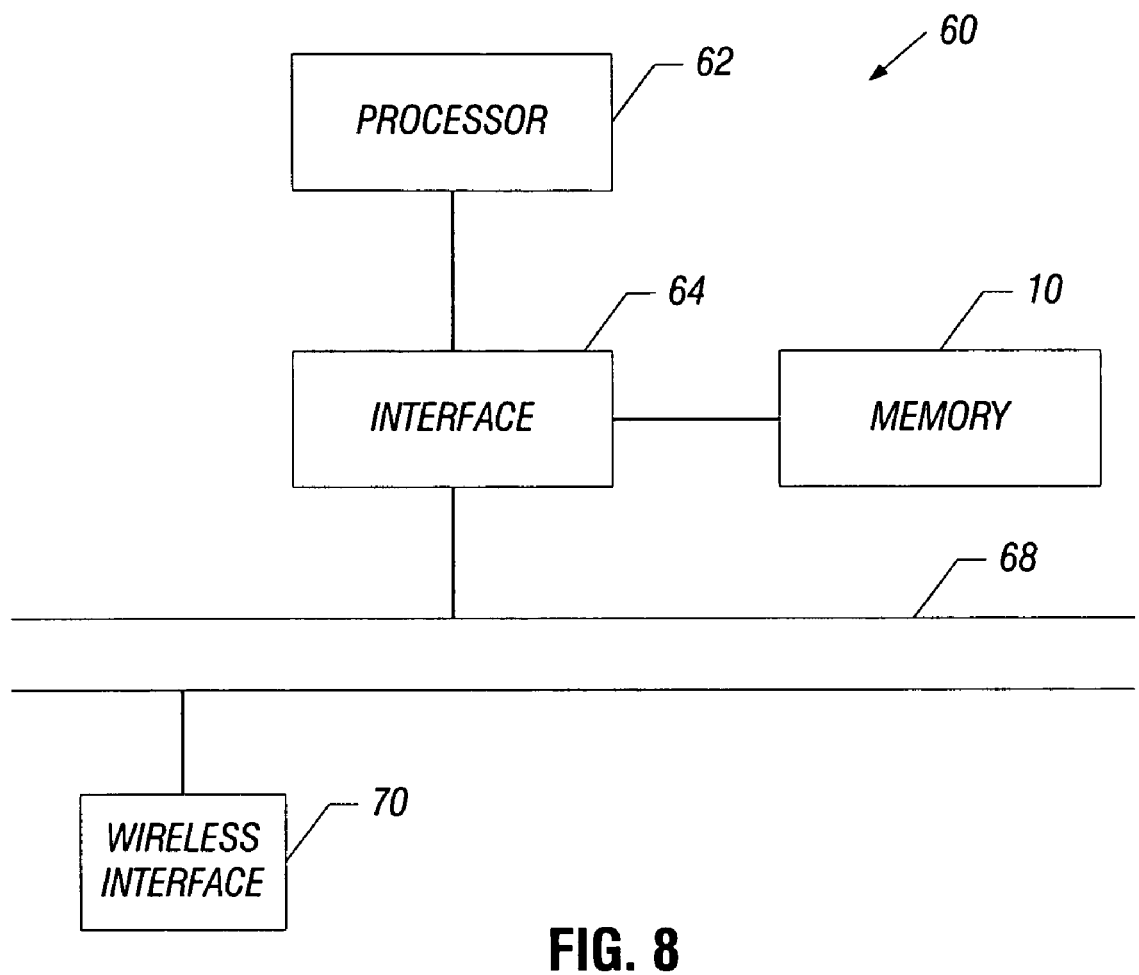
FIG. 8 is a schematic depiction of one embodiment of the present invention.

Referring to FIG. 8, a processor-based system 60 may include a processor 62 coupled to an interface 64. The processor 62 may be a digital signal processor or a general purpose processor, to mention two examples. The interface 64 may be coupled to a bus 68. In one embodiment of present invention, the bus 68 may be coupled to a wireless interface 70. Thus, the system 60 may, in some embodiments, be a wireless interface for facilitating wireless communications. However, non-wireless applications are also contemplated.

The system 60 may include the memory 10 which may be any of memory illustrated in the preceding Figures, including the polymer memories 10, 10a, 10b, 10c, or 10d.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   writing data back to a polymer memory array;
   counting an indication of the number of data write backs to said array;
   periodically automatically refreshing the array by refreshing a single pixel when the indication of the number of write backs exceeds a predetermined number; and incrementing a pointer, in response to the indication of the number of write backs exceeding a predetermined number, to successively refresh substantially all of the pixels in the array.

2. The method of claim 1 including counting the number of data write backs.

3. The method of claim 1 including counting the number of reads to said memory array.

4. The method of claim 1 including incrementing a refresh location pointer when a pixel is refreshed.

5. The method of claim 4 including incrementing an access cycle counter in response to the array being accessed.

6. The method of claim 5 including resetting said access cycle counter in response to said cycle access counter exceeding a given indication.

7. An article comprising a medium storing instructions that, if executed, enable a processor-based system to:
write data back to a polymer memory array;
count an indication of the number of data write backs to said array;
when the indication of the number of write backs exceeds a predetermined number of write backs, automatically refresh said array by refreshing a single pixel;
in response to the indication that the number of write backs exceeds a predetermined number, refresh a different pixel; and
increment a pointer, in response to the indication of the number of write backs exceeding a predetermined number, to successively refresh substantially all of the pixels in the array.

8. The article of claim 7 further storing instructions that, if executed, enable said system to count the number of data write backs.

9. The article of claim 7 further storing instructions that, if executed, enable said system to count the number of reads to said memory array.

10. The article of claim 7 further storing instructions that, if executed, enable said system to increment a refresh location pointer when a pixel is refreshed.

11. The article of claim 10 further storing instructions that, if executed, enable said system to increment an access cycle counter in response to the array being accessed.

12. The article of claim 11 further storing instructions that, if executed, enable said system to reset said access cycle counter in response to said cycle access counter exceeding a given indication.

13. A polymer memory comprising:
a polymer memory array;
a device to automatically periodically refresh a single pixel in said polymer memory array when an indication of a number of write backs exceeds a predetermined number;
refresh a different pixel in response to the indication that the number of write backs exceeds a predetermined number; and
a counter to count an indication of the number of date write backs to said array.

14. The memory of claim 13 wherein said counter counts the number of write backs.

15. The memory of claim 13 wherein said counter counts the number of reads to said memory array.

16. The memory of claim 13 wherein said device increments a pointer, in response to the indication of the number of write backs exceeding a predetermined number, to successfully refresh substantially all the pixels in the array.

* * * * *